United States Patent
Chen et al.

(10) Patent No.: US 9,970,966 B2
(45) Date of Patent: May 15, 2018

(54) METHOD, DEVICE AND COMPUTER STORAGE MEDIUM FOR DETECTING POWER CONSUMPTION OF AN APPLICATION

(71) Applicant: TENCENT TECHNOLOGY (SHENZHEN) COMPANY LIMITED, Shenzhen, Guangdong (CN)

(72) Inventors: Yong Chen, Shenzhen (CN); Yi Fang, Shenzhen (CN); Bin Wang, Shenzhen (CN); Shizhu Huang, Shenzhen (CN)

(73) Assignee: TENCENT TECHNOLOGY (SHENZHEN) CO., LTD., Shenzhen (CN)

( * ) Notice: Subject to any disclaimer, the term of this patent is extended or adjusted under 35 U.S.C. 154(b) by 454 days.

(21) Appl. No.: 14/697,023

(22) Filed: Apr. 27, 2015

(65) Prior Publication Data
US 2015/0233985 A1  Aug. 20, 2015

Related U.S. Application Data

(63) Continuation of application No. PCT/CN2013/090539, filed on Dec. 26, 2013.

(30) Foreign Application Priority Data

May 17, 2013  (CN) .......................... 2013 1 0185841

(51) Int. Cl.
*G01R 21/133* (2006.01)
(52) U.S. Cl.
CPC ................. *G01R 21/133* (2013.01)
(58) Field of Classification Search
CPC ....... G01R 21/133; G06F 1/28; G06F 1/3203; G06F 1/3206; G06F 1/3228; G06F 1/3234
See application file for complete search history.

(56) References Cited

U.S. PATENT DOCUMENTS

2014/0173319 A1  6/2014  Zeng

FOREIGN PATENT DOCUMENTS

| CN | 102200942 A | 9/2011 |
| CN | 102306118 A | 1/2012 |
| CN | 102759673 A | 10/2012 |

OTHER PUBLICATIONS

Pathak et al., What Is Keeping My Phone Awake? Characterizing and Detecting No-Sleep Energy Bugs in Smartphone Apps, Jun. 25-29, 2012, MobiSys' 12, Low Wood Bay, Lake District, UK, 14 pp.*

(Continued)

*Primary Examiner* — Toan Le
(74) *Attorney, Agent, or Firm* — Staas & Halsey LLP

(57) ABSTRACT

Provided is a method for detecting power consumption of an application, including following steps: when a screen of a mobile terminal is turned on, detecting wakeup times, wake-lock time duration and CPU utilization of applications in the time duration of screen-off by a device for detecting power consumption of an application; prompting that power consumption of an application is abnormal by said device when said application satisfies at least one of following conditions: wakeup tunes reach a first threshold value; wake-lock time duration reaches a second threshold value; CPU utilization reaches a third threshold value. The method provided in the present disclosure is capable of detecting whether power consumption of an application is abnormal. In addition, the present disclosure further provides a device and a computer storage medium for detecting power consumption of an application.

10 Claims, 4 Drawing Sheets

(56) References Cited

OTHER PUBLICATIONS

Chinese Office Action dated Jul. 31, 2017, in corresponding Chinese Patent Application No. 201310185841.X.
International Search Report dated Mar. 20, 2014 in International Application No. PCT/CN2013/090539 filed Dec. 26, 2013.

* cited by examiner

METHOD, DEVICE AND COMPUTER STORAGE MEDIUM FOR DETECTING POWER CONSUMPTION OF AN APPLICATION

This application is a continuation of International Application No. PCT/CN2013/090539, entitled "METHOD, DEVICE AND COMPUTER STORAGE MEDIUM FOR DETECTING POWER CONSUMPTION OF AN APPLICATION" filed on Dec. 26, 2013, which claims priority to Chinese patent application No. 201310185841.X, entitled "METHOD AND DEVICE FOR DETECTING POWER CONSUMPTION OF AN APPLICATION" filed on May 17, 2013, both of which are incorporated by reference in their entirety.

TECHNICAL FIELD

The present disclosure relates to smart mobile terminal technology, more particularly to a method, device and a computer storage medium for detecting power consumption of an application.

BACKGROUND ART

With the development of mobile internet, smart mobile terminals are more and more widespread, and large amount of applications spring up to attract massive users. However, some applications often consume too much power due to defects on design or due to inconsideration of power saving.

The prior art method for detecting power consumption of applications is realized by acquiring the amount of power consumption of applications directly, and then analyzing and ranking said applications according to the amount of power consumption (as shown in FIG. 5). Said prior art method for detecting power consumption of applications is based on the amount of power consumption only, however, higher amount of power consumption does not means that the power consumption is abnormal. Therefore, said traditional method can not detect whether power consumption of an application is abnormal.

SUMMARY OF THE INVENTION

In view of defects existing in the prior art mentioned above, in one aspect, the present disclosure provides a method for detecting whether power consumption of an application is abnormal:

A method for detecting power consumption of an application includes following steps:
  when a screen of a mobile terminal is turned on, detecting wakeup times, wake-lock time duration and CPU utilization of applications in a time duration of screen-off by a device for detecting power consumption of an application;
  when an application satisfies at least one of following conditions, prompting that power consumption of the application is abnormal by said device:
  wakeup times reaches a first threshold value;
  wake-lock time duration reaches a second threshold value; and
  CPU utilization reaches a third threshold value;
  when a screen of a mobile terminal is turned on, detecting whether time duration of screen-off reaches a preset value of time duration by said device, if it does, then detecting wakeup times, wake-lock time duration and CPU utilization of applications in the time duration of screen-off.

In another aspect, the present disclosure provides a device for detecting power consumption of an application, including:
  a detecting module, configured to detect, when the screen of the mobile terminal is turned on, wakeup times, wake-lock time duration and CPU utilization of applications in a time duration of screen-off; and further configured to detect whether said time duration of screen-off reaches a preset value of time duration, if it does, then detecting wakeup times, wake-lock time duration and CPU utilization of applications in the time duration of screen-off; and
  an abnormal prompting module, configured to prompt that power consumption of an application is abnormal when said application satisfies at least one of following conditions:
  wakeup times reaches a first threshold value;
  wake-lock time duration reaches a second threshold value; and
  CPU utilization reaches a third threshold value.

In another aspect, the present disclosure provides a computer storage medium for detecting power consumption of an application, including computer executable instructions, said computer executable instructions are configured to execute a method for detecting power consumption of an application, wherein, the method includes:
  when a screen of a mobile device is turned on, detecting wakeup times, wake-lock time duration and CPU utilization of applications in a time duration of screen-off by a device for detecting power consumption of an application;
  when an application satisfies at least one of following conditions, prompting that power consumption of the application is abnormal by said device:
  said wakeup times reaches a first threshold value;
  said wake-lock time duration reaches a second threshold value; and
  said CPU utilization reaches a third threshold value;
  when a screen of a mobile terminal is turned on, detecting whether time duration of screen-off reaches a preset value of time duration by said device, if it does, then detecting wakeup times, wake-lock time duration and CPU utilization of applications in the time duration of screen-off.

The method, device and non-transitory computer readable storage medium mentioned above are configured to detect power consumption of an application by detecting, when the screen of the mobile terminal is turned on, wakeup times, wake-lock time duration and CPU utilization of applications in the time duration of screen-off. When at least one of the three parameters reaches corresponding threshold value, said device prompts that power consumption of an application is abnormal. Because, if the wakeup times or wake-lock time duration or CPU utilization of an application is too high in the time duration of screen-off, it reflects that there are excessive activities existing in said application, which causes power consumption abnormal. Therefore, said method and device are capable of detecting power consumption of an application, thereby the user can process said application having abnormal power consumption according to the prompt.

BRIEF DESCRIPTION OF THE DRAWS

DETAILED DESCRIPTION OF PREFERRED EMBODIMENTS

Figure 1:
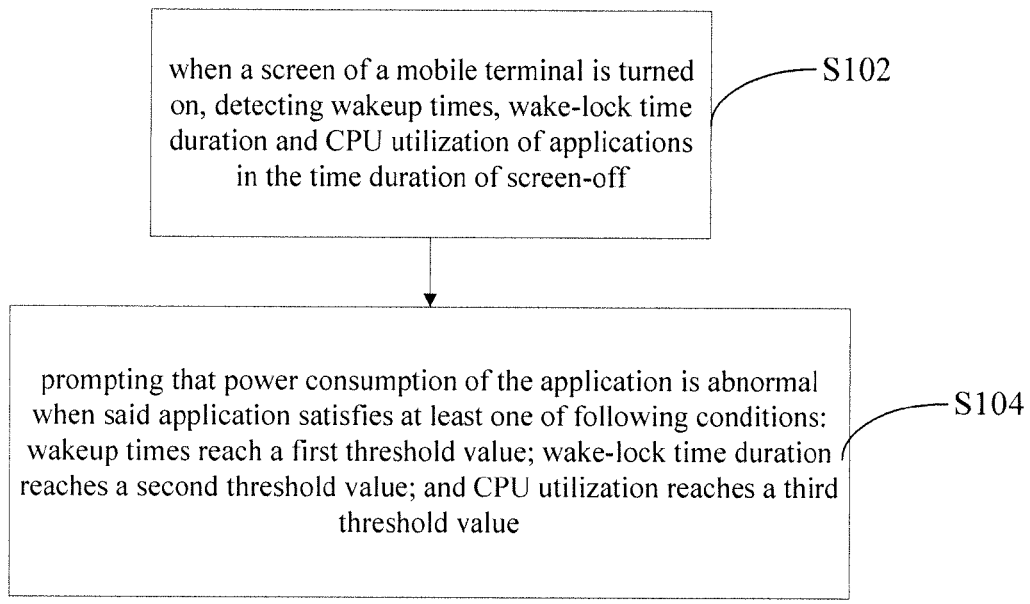
FIG. 1 is a schematic flow diagram illustrating the method for detecting power consumption of an application according to one embodiment of the present invention.

In one embodiment as shown in FIG. 1, a method for detecting power consumption of an application is provided, the method includes following steps:

S102, when a screen of a mobile terminal is turned on, detecting wakeup times, wake-lock time duration and CPU utilization of applications in the time duration of screen-off by a device for detecting power consumption of an application.

The mobile terminal mentioned in the present disclosure refers to all kinds of portable mobile intelligent devices used under wireless network environment, including a mobile phone, a PDA and a tablet PC, and so on. Said time duration of screen-off refers to the period from screen-off to screen-on of a mobile terminal.

In the period from screen-off to screen-on of a mobile terminal, if there is an application whose wakeup times is too many, wake-lock time duration is too long and CPU utilization is too high, it reflects that there are excessive activities existing in said application, which causes power consumption abnormal.

In one embodiment, when a screen of a said mobile terminal is turned on, detecting whether time duration of screen-off reaches preset value of time duration, if it does, then detecting wakeup times, wake-lock time duration and CPU utilization of applications in the time duration of screen-off; if not, then not processing.

In one embodiment, recording current first wakeup times, first wake-lock time duration and first CPU time slice when a screen of a mobile terminal is turned off; furthermore, recording current second wakeup times, second wake-lock time duration and second CPU time slice when said screen of said mobile terminal is turned on.

Furthermore, in said S102, the wakeup times of an application in the time duration of screen-off is calculated as a ratio of the difference between said second wakeup times and said first wakeup times to said time duration of screen-off; the wake-lock time duration of an application in the time duration of screen-off is calculated as a ratio of the difference between said second wake-lock time duration and said first wake-lock time duration to said time duration of screen-off; and the CPU utilization of an application in the time duration of screen-off is calculated as a ratio of the difference between said second CPU time slice and said first CPU time slice to said time duration of screen-off.

S104, prompting that power consumption of the application is abnormal when said application satisfies at least one of following conditions by said device: wakeup times reach a first threshold value; wake-lock time duration reaches a second threshold value; and CPU utilization reaches a third threshold value.

Particularly, when the application satisfies at least one of the three conditions, it reflects that power consumption of said application is abnormal, the method is capable of prompting the user that power consumption of the application is abnormal, and the user may process said application having abnormal power consumption according to the prompt.

Figure 2:
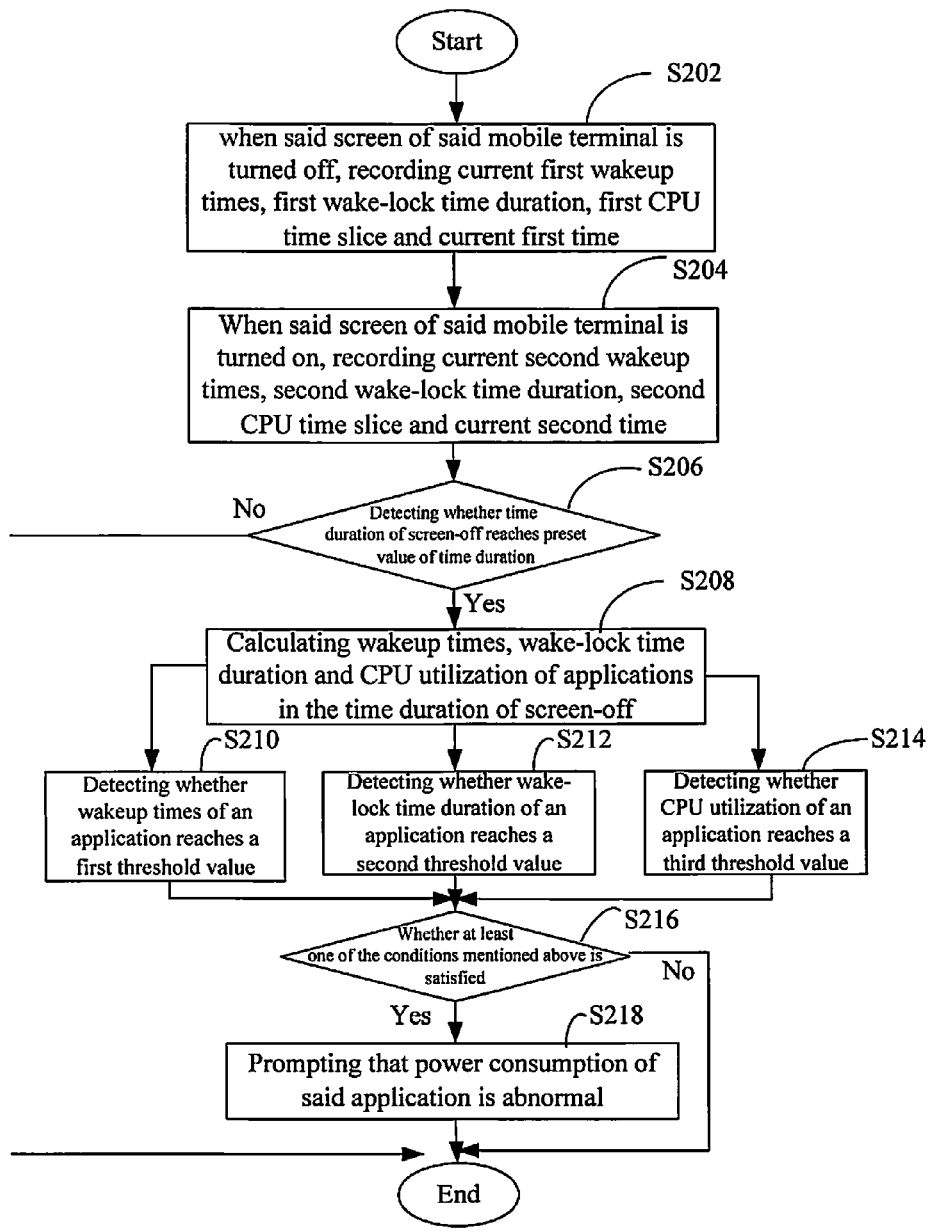
FIG. 2 is a flow diagram illustrating a method for detecting power consumption of an application according to another embodiment of the present invention.

In another embodiment as shown in FIG. 2, a method for detecting power consumption of an application is provided, the method includes following steps:

S202, when said screen of said mobile terminal is turned off, recording current first wakeup times, first wake-lock time duration, first CPU time slice and current first time by said device.

S204, when said screen of said mobile terminal is turned on, recording current second wakeup times, second wake-lock time duration, second CPU time slice and current second time by said device.

S206, detecting whether time duration of screen-off reaches preset value of time duration by said device, if it does, then turning to S208, if not, then going to the end.

Particularly, said time duration of screen-off is time difference between said first time and said second time. Preferably, said preset value of time duration may be, but not limited to, 15 minutes. The possibility of misjudgments can be reduced efficiently and the accuracy of detection can be improved by means of detecting wakeup times, wake-lock time duration and CPU utilization of applications until time duration of screen-off reaches said preset value of time duration.

S208, calculating wakeup times, wake-lock time duration and CPU utilization of applications in the time duration of screen-off by said device.

Particularly, the formula for calculating said wakeup times of each application in the time duration of screen-off is: $(R2-R1)/(T2-T1)$; the formula for calculating said wake-lock time duration of each application in the time duration of screen-off is: $(W2-W1)/(T2-T1)$; the formula for calculating said CPU utilization of each application is: $(N2-N1)/(T2-T1)$. Wherein, R2 is the second wakeup times, R1 is the first wakeup times, W2 is the second wake-lock time duration, W1 is the first wake-lock time duration, N2 is the second CPU time slice, N1 is the first CPU time slice, T2 is the second time, and T1 is the first time.

S210, detecting whether wakeup times of an application reaches a first threshold value by said device.

S212, detecting whether wake-lock time duration of an application reaches a second threshold value by said device.

S214, detecting whether CPU utilization of an application reaches a third threshold value by said device.

S216, judging whether at least one of the conditions mentioned above is satisfied by said device, if it is, then turning to S218, if not, then going to the end.

S218, prompting that power consumption of said application is abnormal by said device.

During the period that a mobile terminal turns from screen-off working state to screen-off standby state, if there is an application not releasing wake-type-partial lock, said mobile terminal will be kept in screen-off working state, thereby causing abnormal power consumption. In this embodiment, wake-lock time duration of each application in the time duration of screen-off can be calculated, if wake-lock time duration of an application reaches said preset second threshold value in the time duration of screen-off, it reflects that said application is likely to continue working in the time duration of screen-off, therefore the power consumption of said application is abnormal.

Moreover, when said mobile terminal gets into screen-off standby state, if there is an application setting an RTC- Wakeup timer, when a certain time is met, system of said mobile terminal will be awakened up and get into screen-off working state, thereby causing power consumption abnormal. In this embodiment, wakeup times of said application can be accumulated and recorded whenever the system is awakened up and gets into screen-off working state, so that, said first wakeup times can be obtained when the screen of said mobile terminal is turned off, and said second wakeup times can be obtained when the screen of said mobile terminal is turned on. If said wakeup times of an application in the time duration of screen-off reaches said first threshold value, it reflects that said wakeup times of said application is too many, and the power consumption of said application is abnormal.

Taking a mobile phone as an example, working states of a mobile phone include screen-on working state, screen-dark working state, screen-off working state and screen-off standby state. Abnormal power consumption means that there are excessive activities existing in an application in the time duration of screen-off of said mobile phone. When the working state of said mobile phone migrates through each of the above working states one by one from screen-on working state to screen-off standby state, the faster is the migration, the lower is the power consumption of said mobile phone. During the process that the working state of said mobile phone migrates from screen-on working state to screen-off standby state, if there is an application maintaining a wake-type-partial lock, said mobile phone will stay at screen-off working state; until all applications release said lock, said mobile phone is able to migrate to screen-off standby state. At screen-off standby state, if there is an application setting an RTC-wakeup timer, when the preset time is met, the system will be awakened up and get into screen-off working state.

Therefore, it can be known effectively which application has excessive activities in the time duration of screen-off of the mobile terminal by detecting wakeup times, wake-lock time duration and CPU utilization of each application in the time duration of screen-off, thereby the system can identify which application has abnormal power consumption, and prompt the user to process the application having abnormal power consumption.

In one preferred embodiment, said first threshold value is 40 times/hour, said second threshold value is 2 minutes/hour and said third threshold value is 3%. It should be understood that said first threshold value, second threshold value and third threshold value are not limited to the values provided in said preferred embodiment.

Figure 3:
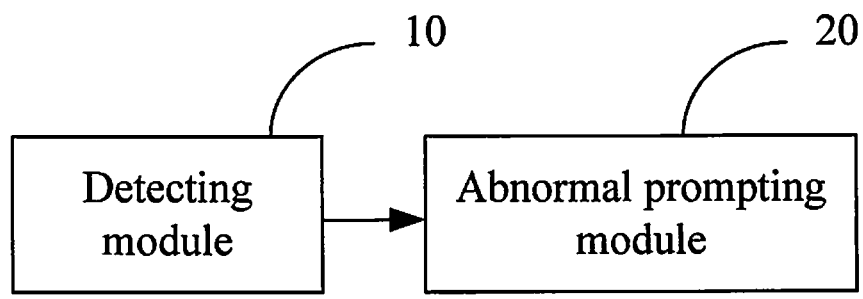
FIG. 3 is a structure diagram illustrating the device for detecting power consumption of an application according to one embodiment of the present invention.

In one embodiment as shown in FIG. 3, a device for detecting power consumption of an application is provided; the device includes a detecting module 10 and an abnormal prompting module 20.

Wherein, said detecting module 10 is configured to detect, when the screen of the mobile terminal is turned on, wakeup times, wake-lock time duration and CPU utilization of applications in the time duration of screen-off.

In an embodiment, said detecting module 10 is configured to detect, when the screen of the mobile terminal is turned on, whether time duration of screen-off reaches preset value of time duration, if it does, then detecting wakeup times, wake-lock time duration and CPU utilization of applications in the time duration of screen-off. Preferably, said preset value of time duration may be, but not limited to, 15 minutes. The possibility of misjudgments can be reduced efficiently and the accuracy of detection can be improved by means of detecting wakeup times, wake-lock time duration and CPU utilization of applications until time duration of screen-off reaches said preset value of time duration.

Said abnormal prompting module 20 is configured to promote that power consumption of an application is abnormal when said application satisfies at least one of following conditions: wakeup times reaches a first threshold value; wake-lock time duration reaches a second threshold value; and CPU utilization reaches a third threshold value.

In one preferred embodiment, said first threshold value is 40 times/hour, said second threshold value is 2 minutes/hour and said third threshold value is 3%.

Figure 4:
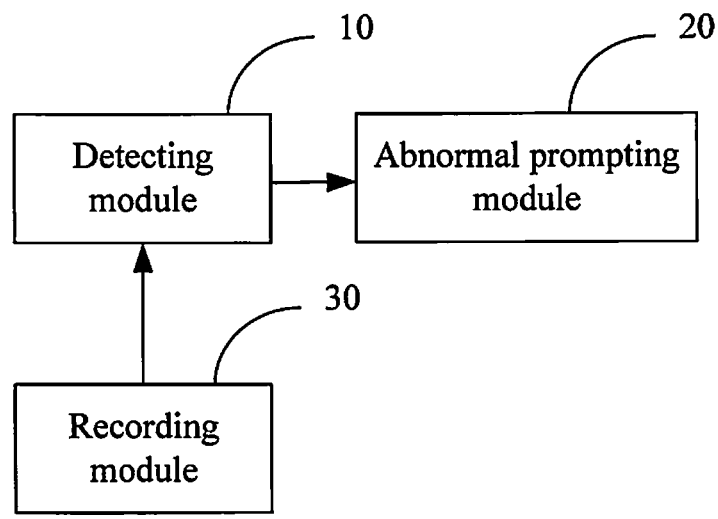
FIG. 4 is a structure diagram illustrating a device for detecting power consumption of an application according to another embodiment of the present invention.
Figure 5:
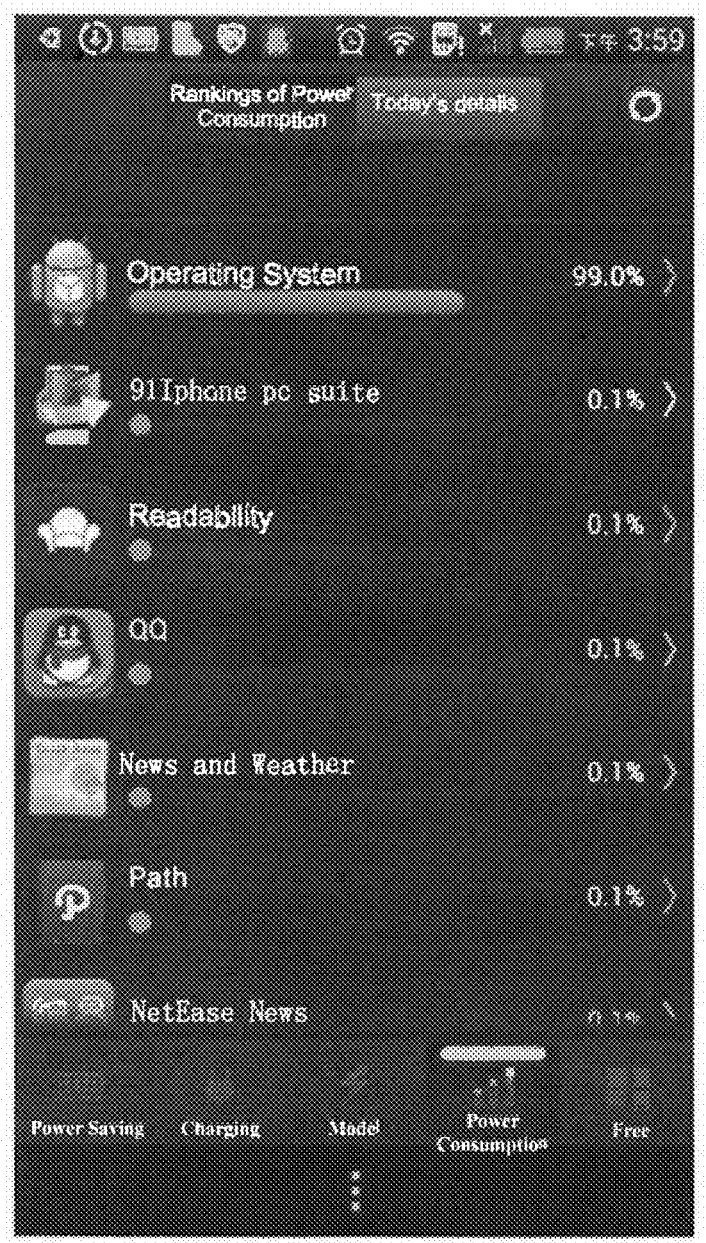
FIG. 5 is a schematic diagram illustrating a ranking list of power consumption of applications in the prior art.

In another embodiment as shown in FIG. 4, said device for detecting power consumption of an application further includes a recording module 30, configured to record, when said screen of said mobile terminal is turned off, current first wakeup times, first wake-lock time duration and first CPU time slice.

Furthermore, in one embodiment, said recording module 30 is further configured to record, when said screen of said mobile terminal is turned on, current second wakeup times, second wake-lock time duration and second CPU time slice.

In this embodiment, said detecting module 10 is configured to calculate the wakeup times of applications being as a ratio of the difference between said second wakeup times and said first wakeup times to said time duration of screen-off; calculating the wake-lock time duration of applications being as a ratio of the difference between said second wake-lock time duration and said first wake-lock time duration to said time duration of screen-off; and calculating the CPU utilization of applications being as a ratio of the difference between said second CPU time slice and said first CPU time slice to said time duration of screen-off.

Furthermore, said recording module 30 is capable of recording current first time when the screen of said mobile terminal is turned off and current second time when the screen of said mobile terminal is turned on. Said time duration of screen-off is the time difference between said first time and said second time.

Since said method, device and computer storage medium for detecting power consumption of an application mentioned above are capable of detecting wakeup times, wake-lock time duration and CPU utilization of applications, it can be detected which application has excessive activities in the time duration of screen-off, thereby the system of the device can identify which application has abnormal power consumption, and prompt the user to process the application having abnormal power consumption.

By means of setting preset value of time duration, the possibility of misjudgments can be reduced efficiently and the accuracy of detection can be improved by means of detecting the abnormal power consumption of the application until time duration of screen-off reaches said preset value of time duration.

It should be understood by those skilled in the art that all or part of the processes of preferred embodiments disclosed above may be realized through relevant hardware commanded by computer program instructions. Said program may be saved in a computer readable storage medium of the computer, and said program may include the processes of the preferred embodiments mentioned above when it is executed. Wherein, said storage medium may be a diskette, optical disk, ROM (Read-Only Memory) or RAM (Random Access Memory), and so on.

It should be understood by those skilled in the art that what described above are preferred embodiments of the present invention. Various modifications and replacements may be made therein without departing from the theory of the present disclosure, which should also be seen in the scope of the present disclosure.

What is claimed is:

1. A method for detecting power consumption of an application, comprising:
   when a screen of a mobile terminal is turned on, detecting wakeup times, wake-lock time duration and CPU utilization of applications in a time duration of screen-off by the mobile terminal;
   when an application satisfies at least one of following conditions, prompting that power consumption of the application is abnormal by the mobile terminal to a user to process the application having abnormal power consumption:
   said wakeup times reaches a first threshold value, wherein said wakeup times is a ratio value of a difference between a second wakeup times and a first wakeup times to said time duration of screen-off;
   said wake-lock time duration reaches a second threshold value, wherein said wake-lock time duration of applications is a ratio value of a difference between a second wake-lock time duration and a first wake-lock time duration to said time duration of screen-off; and
   said CPU utilization reaches a third threshold value, wherein said CPU utilization of applications is a ratio value of a difference between a second CPU time slice and a first CPU time slice to said time duration of screen-off;
   when a screen of a mobile terminal is turned on, detecting whether time duration of screen-off reaches a preset value of time duration by the mobile terminal, if it does, then detecting wakeup times, wake-lock time duration and CPU utilization of applications in the time duration of screen-off.

2. The method for detecting power consumption of an application according to claim 1, further comprising:
   recording, when said screen of mobile terminal is turned off, said current first wakeup times, said first wake-lock time duration and said first CPU time slice of applications by said device.

3. The method for detecting power consumption of an application according to claim 2, further comprising:
   recording, when said screen of mobile terminal is turned on, said current second wakeup times, said second wake-lock time duration and said second CPU time slice of applications by said device.

4. A device for detecting power consumption of an application, the device being a mobile terminal, comprising:
   a detecting module, configured to detect, when a screen of a mobile terminal is turned on, wakeup times, wake-lock time duration and CPU utilization of applications in a time duration of screen-off; and further configured to detect whether said time duration of screen-off reaches a preset value of time duration, if it does, then detecting wakeup times, wake-lock time duration and CPU utilization of applications in the time duration of screen-off;
   an abnormal prompting module, configured to prompt that power consumption of an application is abnormal to a user to process said application having abnormal power consumption, when said application satisfies at least one of following conditions:
   said wakeup times reaches a first threshold value, wherein said wakeup times is a ratio value of a difference between a second wakeup times and a first wakeup times to said time duration of screen-off;
   said wake-lock time duration reaches a second threshold value, wherein said wake-lock time duration of applications is a ratio value of a difference between a second wake-lock time duration and a first wake-lock time duration to said time duration of screen-off; and
   said CPU utilization reaches a third threshold value, wherein said CPU utilization of applications is a ratio value of a difference between a second CPU time slice and a first CPU time slice to said time duration of screen-off.

5. The device for detecting power consumption of an application according to claim 4, further comprises:
   a recording module, configured to record, when said screen of said mobile terminal is turned off, said current first wakeup times, said first wake-lock time duration and said first CPU time slice of applications.

6. The device for detecting power consumption of an application according to claim 5, wherein, said recording module is further configured to record, when said screen of said mobile terminal is turned on, said current second wakeup times, said second wake-lock time duration and said second CPU time slice of applications.

7. The device for detecting power consumption of an application according to claim 4, wherein, said mobile terminal is a mobile phone or a personal digital assistant or a tablet PC.

8. A non-transitory computer readable storage medium, including computer executable instructions, said computer executable instructions are configured to execute a method for detecting power consumption of an application, wherein, the method comprises:
   when a screen of a mobile terminal is turned on, detecting wakeup times, wake-lock time duration and CPU utilization of applications in a time duration of screen-off by a mobile terminal;
   when an application satisfies at least one of following conditions, prompting that power consumption of the application is abnormal by the mobile terminal to a user to process the application having abnormal power consumption:
   said wakeup times reaches a first threshold value, wherein said wakeup times is a ratio value of a difference between a second wakeup times and a first wakeup times to said time duration of screen-off;
   said wake-lock time duration reaches a second threshold value, wherein said wake-lock time duration of applications is a ratio value of a difference between a second wake-lock time duration and a first wake-lock time duration to said time duration of screen-off; and
   said CPU utilization reaches a third threshold value, wherein said CPU utilization of applications is a ratio value of a difference between a second CPU time slice and a first CPU time slice to said time duration of screen-off;
   when a screen of a mobile terminal is turned on, detecting whether time duration of screen-off reaches a preset value of time duration by the mobile terminal, if it does, then detecting wakeup times, wake-lock time duration and CPU utilization of applications in the time duration of screen-off.

9. The non-transitory computer readable storage medium according to claim 8, wherein, the method further comprises:
   recording, when said screen of mobile terminal is turned off, said current first wakeup times, said first wake-lock time duration and said first CPU time slice of applications by said device.

10. The non-transitory computer readable storage medium according to claim 9, wherein, the method further comprises:

recording, when said screen of mobile terminal is turned on, said current second wakeup times, said second wake-lock time duration and said second CPU time slice of applications by said device.

\* \* \* \* \*